United States Patent
Jang et al.

(10) Patent No.: US 8,519,786 B2
(45) Date of Patent: Aug. 27, 2013

(54) VARIABLE GAIN AMPLIFIER WITH FIXED BANDWIDTH

(75) Inventors: Seunghyun Jang, Daejeon (KR); Jae Ho Jung, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 14 days.

(21) Appl. No.: 13/296,626

(22) Filed: Nov. 15, 2011

(65) Prior Publication Data

US 2012/0126895 A1    May 24, 2012

(30) Foreign Application Priority Data

Nov. 19, 2010  (KR) .................. 10-2010-0115713

(51) Int. Cl.
*H03F 1/34* (2006.01)
*H03G 3/20* (2006.01)

(52) U.S. Cl.
USPC ........................................... 330/86; 330/282

(58) Field of Classification Search
USPC .................... 330/86, 144, 282, 284
See application file for complete search history.

(56) References Cited

U.S. PATENT DOCUMENTS

2006/0197592 A1* 9/2006 Chang ............................ 330/86
2009/0167432 A1* 7/2009 van den Heuvel ............. 330/69

OTHER PUBLICATIONS

Vito Giannini, Baseband Analog Circuits for Software Defined Radio, 2008, pp. 107-118.
Pui-In Mak et al., On the Design of a Programmable-Gain Amplifier With Built-In Compact DC-Offset Cancellers for Very Low-Voltage WLAN Systems, IEEE Transactions on Circuits and Systems-I: Regular Papers, 2008, pp. 496-509, vol. 55, No. 2.

* cited by examiner

*Primary Examiner* — Steven J Mottola
(74) *Attorney, Agent, or Firm* — William Park & Associates Patent Ltd.

(57) ABSTRACT

Provided is a variable gain amplifier. The variable gain amplifier includes an operational amplifier, a variable feedback impedance unit, a variable compensation impedance unit, and a variable current source. The variable feedback impedance unit is connected between an inverting input terminal and output terminal of the operational amplifier, and has a feedback impedance value which varies for gain control. The variable compensation impedance unit is connected to the inverting input terminal, and has a compensation impedance value which varies in response to change of the feedback impedance value for maintaining a constant feedback factor. The variable current source is connected to the inverting input terminal, and supplies an output current, which varies in response to change of the compensation impedance value, to the variable compensation impedance unit.

15 Claims, 5 Drawing Sheets

Fig. 3

| Gain(dB) | CTRL | | | |
|---|---|---|---|---|
| | b1 | b2 | b3 | b4 |
| +12 | 0 | 0 | 0 | 0 |
| +6 | 1 | 0 | 0 | 0 |
| 0 | 1 | 1 | 0 | 0 |
| -6 | 1 | 1 | 1 | 0 |
| -12 | 1 | 1 | 1 | 1 |

VARIABLE GAIN AMPLIFIER WITH FIXED BANDWIDTH

CROSS-REFERENCE TO RELATED APPLICATIONS

This U.S. non-provisional patent application claims priority under 35 U.S.C. §119 of Korean Patent Application No. 10-2010-0115713, filed on Nov. 19, 2010, the entire contents of which are hereby incorporated by reference.

BACKGROUND OF THE INVENTION

The present invention disclosed herein relates to an amplifier, and more particularly, to a variable gain amplifier.

Variable gain amplifiers are devices that control a gain and amplify an input signal in order to maintain the amplitude of an output signal in a certain range. For example, when analog circuits process analog audio or video signals, the variable gain amplifiers are used to control the amplitude of an input signal in order for an output signal not to be saturated. In a communication system, alternatively, when the output signal of a transmitter is attenuated by a channel in which a great loss occurs and is inputted to a receiver, the variable gain amplifier compensates for attenuation that is caused by the channel.

SUMMARY OF THE INVENTION

The present invention provides a variable gain amplifier which operates at a low power while maintaining constant frequency characteristic even when a gain varies and an output voltage is swung.

Embodiments of the present invention provide a variable gain amplifier including: an operational amplifier; a variable feedback impedance unit connected between an inverting input terminal and output terminal of the operational amplifier, and having a feedback impedance value which varies for gain control; a variable compensation impedance unit connected to the inverting input terminal, and having a compensation impedance value which varies in response to change of the feedback impedance value for maintaining a constant feedback factor; and a variable current source connected to the inverting input terminal, and supplying an output current, which varies in response to change of the compensation impedance value, to the variable compensation impedance unit.

In some embodiments, the variable feedback impedance unit may include a fixed feedback impedance element and a plurality of selection feedback impedance elements, and each of the selection feedback impedance elements may be selectively connected to the fixed feedback impedance element in parallel.

In other embodiments, the variable compensation impedance unit may include a plurality of MOS transistors and a plurality of compensation impedance elements which respectively correspond to the selection feedback impedance elements, each of the compensation impedance elements may be connected between the inverting input terminal and one of a drain and source of a corresponding MOS transistor, the other of the drain and source of the corresponding MOS transistor may be selectively connected to a ground, and a gate of the corresponding MOS transistor may be connected to one of the drain and the source.

In still other embodiments, the variable current source may include a plurality of independent current sources selectively connected between a driving power source and the inverting input terminal.

In even other embodiments, the variable current source may include a current minor varying the output current driven by a reference current to supply the varied output current to the variable compensation impedance unit.

In yet other embodiments, the variable gain amplifier may further include a control circuit generating a control signal on the basis of a look up table which includes information on gain control, wherein the feedback impedance value, the compensation impedance value and the output current may vary in response to the control signal.

In other embodiments of the present invention, a variable gain amplifier includes: an operational amplifier; a fixed feedback impedance element connected between an inverting input terminal and output terminal of the operational amplifier; a selection feedback impedance element selectively connected to the fixed feedback impedance element in parallel; a MOS transistor having a gate, a drain and a source, wherein one of the drain and the source is selectively connected to a ground, and the other is connected to the gate; a compensation impedance element connected between the inverting input terminal and the other of the drain and source of the MOS transistor; and a current source selectively connected between a driving power source and the inverting input terminal.

In some embodiments, the variable gain amplifier may further include a control circuit generating a control signal on the basis of a look up table which includes information on gain control, wherein whether to respectively connect the selection feedback impedance element, the MOS transistor and the current source may be determined by the control signal.

In other embodiments, the variable gain amplifier may further include an input impedance element connected to the inverting input terminal, wherein a rate of an impedance value of the fixed feedback impedance element to an impedance value of the input impedance element may be the same as a rate of an impedance value of the selection feedback impedance element to a value which is obtained by summing an impedance value of the compensation impedance element and an impedance value of the MOS transistor.

In still other embodiments, the current source may generate an output current corresponding to a compensation impedance current which flows through the compensation impedance element and the MOS transistor.

In even other embodiments, the current source may include a current mirror generating an output current driven by a reference current.

In still other embodiments of the present invention, a variable gain amplifier includes: an operational amplifier; a first variable feedback impedance unit connected between an inverting input terminal and non-inverting output terminal of the operational amplifier, and having a first feedback impedance value; a second variable feedback impedance unit connected between a non-inverting input terminal and inverting output terminal of the operational amplifier, and having a second feedback impedance value; a first variable compensation impedance unit connected to the inverting input terminal, and having a first compensation impedance value which varies in response to change of the first feedback impedance value for maintaining a constant first feedback factor; a second variable compensation impedance unit connected to the non-inverting input terminal, and having a second compensation impedance value which varies in response to change of the second feedback impedance value for maintaining a constant second feedback factor; a first variable current source connected to the inverting input terminal, and supplying a first output current, which varies in response to change of the first compensation impedance value, to the first variable compensation impedance unit; and a second variable current source connected to the non-inverting input terminal, and supplying a second output current, which varies in response to change of the second compensation impedance value, to the second variable compensation impedance unit.

In some embodiments, the variable gain amplifier may further include: a first input impedance element connected to the inverting input terminal; and a second input impedance element connected to the non-inverting input terminal, wherein the first feedback factor may be defined as a rate of the first feedback impedance value to a combined impedance value which is obtained by combining an input impedance value of the first input impedance element and the first compensation impedance value, and the second feedback factor may be defined as a rate of the second feedback impedance value to a combined impedance value which is obtained by combining an input impedance value of the second input impedance element and the second compensation impedance value.

In other embodiments, the first and second feedback factors may be the same.

In still other embodiments, each of the first and second variable current sources may include a current mirror having a cascode structure.

In even other embodiments, the variable gain amplifier may further include a control circuit generating a control signal on the basis of a monitored result for an output voltage between the inverting output terminal and the non-inverting output terminal, wherein the first and second feedback impedance values, the first and second compensation impedance values, and the first and second output currents may vary in response to the control signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 3 is a diagram exemplarily showing a look up table which is included in a control circuit of FIG. 1;

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
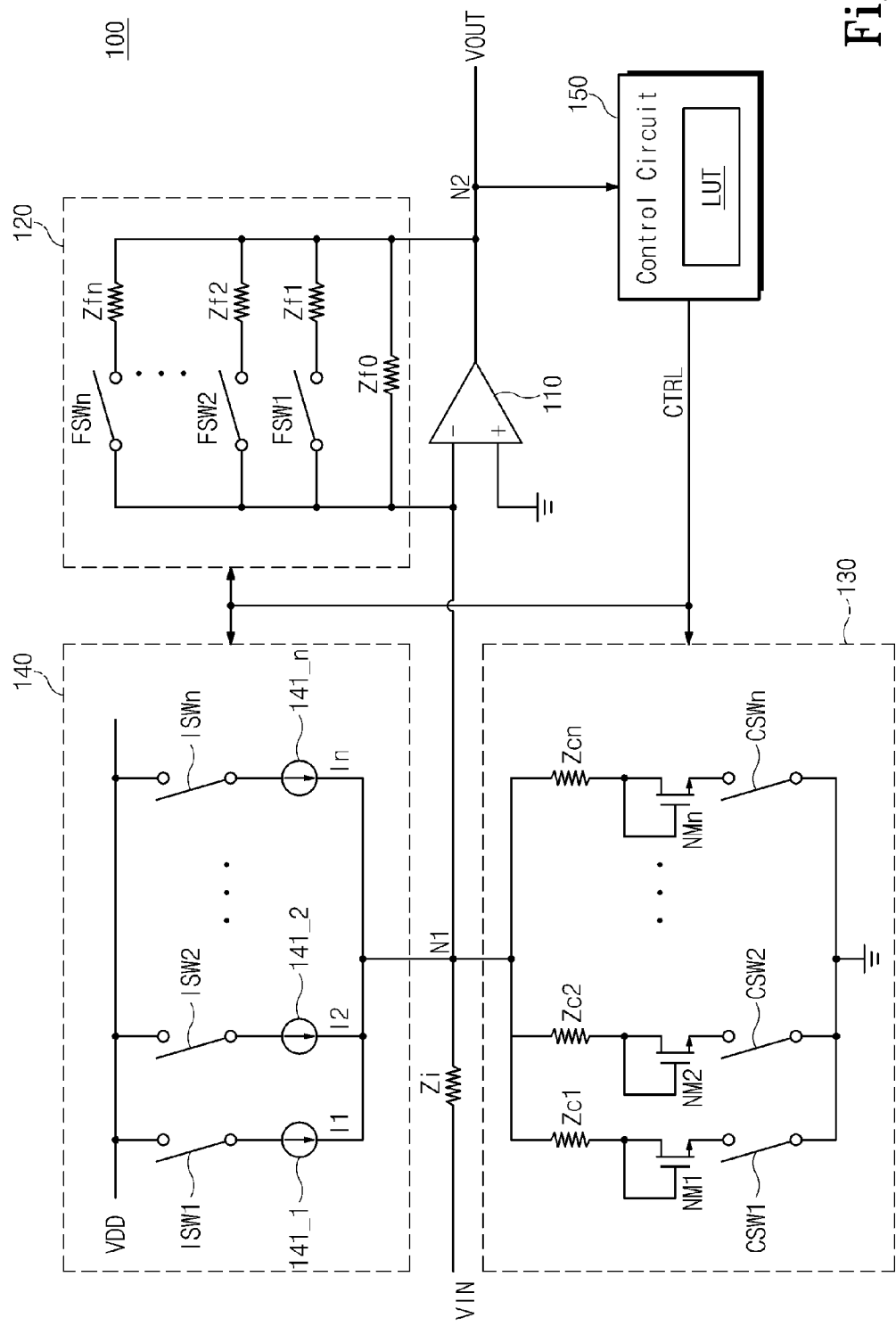
FIG. 1 is a circuit diagram illustrating a variable gain amplifier according to a first embodiment of the present invention.

FIG. 1 is a circuit diagram illustrating a variable gain amplifier according to a first embodiment of the present invention.

Referring to FIG. 1, a variable gain amplifier 100 includes an operational amplifier 110, a variable feedback impedance unit 120, a variable compensation impedance unit 130, a variable current source 140, and a control circuit 150.

The operational amplifier 110 receives a voltage through an inverting input terminal N1 to amplify a voltage difference between the inverting input terminal N1 and a non-inverting input terminal, and outputs the amplified voltage. The inverting input terminal N1 of the operational amplifier 110 is connected to an input impedance element Zi. The non-inverting input terminal of the operational amplifier 110 is connected to a ground.

The variable feedback impedance unit 120 is connected between the inverting input terminal N1 and output terminal N2 of the operational amplifier 110. The variable feedback impedance unit 120 includes a fixed feedback impedance element Zf0, a plurality of selection feedback impedance elements Zf1 to Zfn, and a plurality of feedback impedance switches FSW1 to FSWn.

Each of the selection feedback impedance elements Zf1 to Zfn is selectively connected to the fixed feedback impedance element Zf0 in parallel, and thus the feedback impedance value of the variable feedback impedance unit 120 varies. Each of the selection feedback impedance elements Zf1 to Zfn is selectively connected to the fixed feedback impedance element Zf0 in parallel by turn-on/off of a corresponding feedback impedance switch among the feedback impedance switches FSW1 to FSWn.

The gain of the variable gain amplifier 100 is defined as Equation (1) below.

$$Av = VOUT/VIN = -(Zf0//Zf1// \ldots //Zfn)/Zi \qquad (1)$$

where VIN is an input voltage of the variable gain amplifier 100, and VOUT is an output voltage of the variable gain amplifier 100. Zi is an input impedance value (i.e., an impedance value of the input impedance element), and (Zf0//Zf1// . . . //Zfn) is a feedback impedance value.

Referring to the Equation (1), the gain of the variable gain amplifier 100 varies with the feedback impedance value. That is, the gain of the variable gain amplifier 100 varies according to whether each of the selection feedback impedance elements Zf1 to Zfn is connected thereto.

In an amplification circuit, frequency characteristic varies by properties of a gain-bandwidth product when a gain varies. That is, in the amplification circuit, there are the opposed properties between a gain and a bandwidth. Therefore, whenever the gain of the variable gain amplifier 100 increases or decreases, the bandwidth of the variable gain amplifier 100 decreases or increases. However, a constant bandwidth (i.e., frequency characteristic) is required to be maintained even when a gain varies, for stable operation of the variable gain amplifier 100.

The variable compensation impedance unit 130 is connected to the inverting input terminal N1 of the operational amplifier 110. The variable compensation impedance unit 130 includes a plurality of compensation impedance elements Zc1 to Zcn, a plurality of Metal Oxide Semiconductor (MOS) transistors NM1 to NMn, and a plurality of compensation impedance switches CSW1 to CSWn. Although a plurality of N-type MOS transistors NM1 to NMn are illustrated in FIG. 1, the variable compensation impedance unit 130 may include a plurality of P-type MOS transistors.

Each of the compensation impedance elements Zc1 to Zcn is connected to the inverting input terminal N1 of the operational amplifier 110 and a drain of a corresponding MOS transistor among the MOS transistors NM1 to NMn. Each of the compensation impedance switches CSW1 to CSWn is connected to the ground and a source of a corresponding MOS transistor among the MOS transistors NM1 to NMn. The gate and drain of each of the MOS transistors NM1 to NMn are connected to each other, and thus the MOS transistors NM1 to NMn are always turned on.

The compensation impedance elements Zc1 to Zcn and the MOS transistors NM1 to NMn are selectively connected between the inverting input terminal N1 of the operational amplifier 110 and the ground, and thus the compensation impedance value of the variable compensation impedance unit 130 varies. The compensation impedance elements Zc1 to Zcn and the MOS transistors NM1 to NMn are selectively connected between the inverting input terminal N1 of the operational amplifier 110 and the ground by turn-on/off of a corresponding compensation impedance switch among the compensation impedance switches CSW1 to CSWn.

A feedback factor (β) of the variable gain amplifier 100 is defined as Equation (2) below.

$$\beta=1/\{1+(Zf0//Zf1//\ldots //Zfn)/(Zi//(Zc1+Zm1)//\ldots //(Zcn+Zmn))\} \quad (2)$$

where Zm1 to Zmn are impedance values of the MOS transistors NM1 to NMn, respectively. (Zc1+Zm1)// ... //(Zcn+Zmn) is a compensation impedance value.

Referring to the Equation (2), the feedback factor of the variable gain amplifier 100 varies with the feedback impedance value and the compensation impedance value. That is, the feedback factor of the variable gain amplifier 100 varies according to whether each of the selection feedback impedance elements Zf1 to Zfn, each of the compensation impedance elements Zc1 to Zcn and each of the MOS transistors NM1 to NMn are connected thereto.

The feedback factor of the variable gain amplifier 100 affects frequency characteristic. Accordingly, even when a gain varies with the feedback impedance value, constant frequency characteristic can be maintained by maintaining the constant feedback factor of the variable gain amplifier 100.

Even when the feedback impedance value varies, the constant feedback factor of the variable gain amplifier 100 can be maintained by varying the compensation impedance value in response to the variableness. For this, sum of the impedance value of the kth compensation impedance element Zck and the impedance value Zmk of the kth MOS transistor NMk satisfies Equation (3) below.

$$Zck+Zmk=Zi\cdot Zfk/Zf0(k=1,2,\ldots,n) \quad (3)$$

In other words, the Equation (3) denotes that the following two rates are the same. A first rate is the rate (Zfk/Zf0) of the impedance value of the fixed feedback impedance element Zf0 to the impedance value of the kth selection feedback impedance element Zfk. A second rate is the rate ([Zck+Zmk]/Zi) of the impedance value of the input impedance element Zi to the sum of the impedance value of the kth compensation impedance element Zck and the impedance value Zmk of the kth MOS transistor NMk.

The impedance value Zmk of the kth MOS transistor NMk is defined as Equation (4) below.

$$Zmk=1/\{\mu\cdot Cox\cdot(W/L)k\cdot(Vmk-Vth)\}(k=1,2,\ldots,n) \quad (4)$$

where μ, Cox and Vth indicate the mobility, gate-oxide capacitance and threshold voltage of each of the MOS transistors NM1 to NMn, respectively. (W/L)k indicates the rate of length to width of the kth MOS transistor NMk. Vmk indicates a drain of the kth MOS transistor NMk.

A constant voltage is applied between the drain and source of each of the MOS transistors NM1 to NMn, almost independently from change of a current. This denotes that the voltage drops of compensation impedance elements Zc1 to Zcn respectively corresponding to the MOS transistors NM1 to NMn may decrease. As a result, each of the MOS transistors NM1 to NMn is connected to a corresponding compensation impedance element among the compensation impedance elements Zc1 to Zcn, and thus consumption power can be reduced. In this case, a compensation impedance current Ik flowing through the kth compensation impedance element Zck is defined as Equation (5) below.

$$Ik=(Vx-Vmk)/Zck(k=1,2,\ldots,n) \quad (5)$$

where Vx indicates a voltage that is applied to the inverting input terminal N1 of the operational amplifier 110. Vmk, as described above, indicates a voltage that is applied to the drain of the kth MOS transistor NMk.

The variable compensation impedance unit 130 is connected to the inverting input terminal N1 of the operational amplifier 110, and thus a current path is formed between the inverting input terminal N1 of the operational amplifier 110 and the ground. A compensation impedance current flowing through the current path may be inputted from the variable feedback impedance unit 120 and affect the gain and feedback factor of the variable gain amplifier 100. Furthermore, the compensation impedance current varies with the compensation impedance value. In order to prevent the compensation impedance current from being inputted from the variable feedback impedance unit 120, therefore, a varied current is required to be provided to the variable compensation impedance unit 130 in response to change of the compensation impedance value.

The variable current source 140 is connected to the inverting input terminal N1 of the operational amplifier 110. The variable current source 140 includes a plurality of independent current sources 141_1 to 141_n, and a plurality of current switches ISW1 to ISWn. However, configuration of the variable current source 140 is not limited thereto. The variable current source 140 may include a current minor that generates an output current driven by a reference current. This will be described below in more detail with reference to FIG. 2.

The variable current source 140 supplies a varied output current to the variable compensation impedance unit 130 in response to change of the compensation impedance value. Each of the independent current sources 141_1 to 141_n is selectively connected between a driving power source VDD and the inverting input terminal N1 of the operational amplifier 110, and thus the output current of the variable current source 140 varies. That is, the output current of the variable current source 140 selectively includes at least one of currents I1 to In that are generated by the independent current sources 141_1 to 141_n. Each of the independent current sources 141_1 to 141_n is selectively connected between the driving power source VDD and the inverting input terminal N1 of the operational amplifier 110 by turn-on/off of a corresponding current switch among the current switches ISW1 to ISWn.

The control circuit 150 includes a Look Up Table (LUT) having information of gain control. The control circuit 150 generates a control signal CTRL on the basis of a monitored result for the output voltage VOUT. At this point, the control circuit 150 references the LUT. The LUT will be described below in more detail with reference to FIG. 3.

The control circuit 150 transfers a control signal CTRL to the variable feedback impedance unit 120, the variable compensation impedance unit 130 and the variable current source 140. The feedback impedance switches FSW1 to FSWn, the compensation impedance switches CSW1 to CSWn and the current switches ISW1 to ISWn are controlled by the control signal CTRL. Herein, the control signal CTRL may be a digital signal.

Switches corresponding to each other may be turned on/off together in response to the control signal CTRL. For example, the kth feedback impedance switch FSWk, the kth compensation impedance switch CSWk and the kth current switch ISWk (where k=1, 2, . . . , n) may be turned on/off together.

Figure 2:
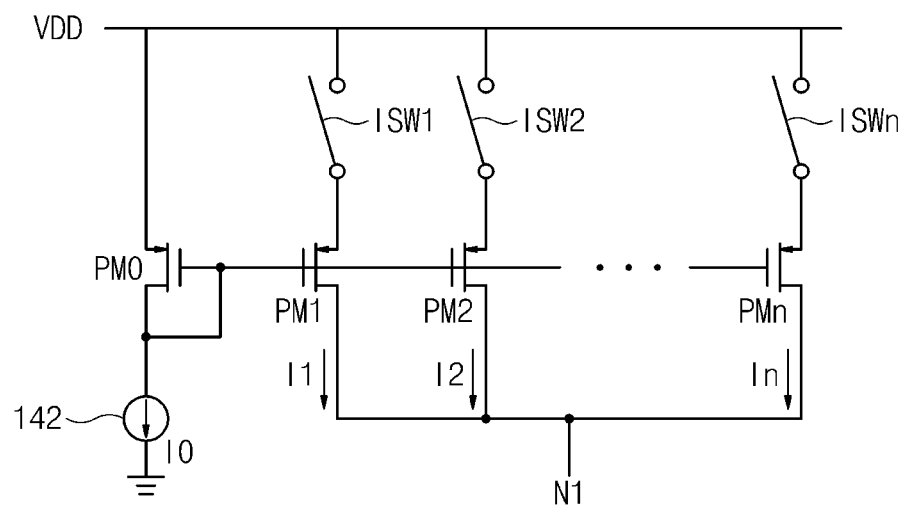
FIG. 2 is a circuit diagram illustrating another embodiment of a variable current source of FIG. 1.

FIG. 2 is a circuit diagram illustrating another embodiment of the variable current source of FIG. 1.

Referring to FIG. 2, the variable current source 140 is implemented as a current mirror having a cascode structure. The variable current source 140 includes a reference current source 142, a plurality of MOS transistors PM0 to PMn, and a plurality of current switches ISW1 to ISWn. For conciseness, P-type MOS transistors PM0 to PMn are illustrated.

The reference current source 142 and the reference MOS transistor PM0 configure a driving stage of the current minor that generates a reference current I0. The reference current source 142 is connected between a drain of the reference MOS transistor PM0 and the ground. A source of the reference MOS transistor PM0 is connected to the driving power source VDD. The drain and gate of the reference MOS transistor PM0 are connected to each other.

The first to nth MOS transistors PM1 to PMn configure output stages of the current mirror that generates first to nth currents I1 to In, respectively. The sources of the first to nth MOS transistors PM1 to PMn are selectively connected to the driving power source VDD according to whether the first to nth current switches ISW1 to ISWn are turned on/off. The drains of the first to nth MOS transistors PM1 to PMn are connected to the inverting input terminal N1 of the operational amplifier 110 (see FIG. 1). The gates of the first to nth MOS transistors PM1 to PMn are connected to the gate of the reference MOS transistor PM0.

Each of the output stages is selectively connected to the driving power source VDD by a corresponding current switch among the current switches ISW1 to ISWn, and thus the output current of the variable current source 140 varies. That is, each of the sources of the first to nth MOS transistors PM1 to PMn is selectively connected to the driving power source VDD, and thus the output current of the variable current source 140 varies.

FIG. 3 is a diagram exemplarily showing the look up table which is included in the control circuit of FIG. 1.

Referring to FIG. 3, the LUT stores information on the control signal CTRL based on a gain. Herein, the control signal CTRL may be a 4-bit digital signal.

The turn-on/off of the feedback impedance switches FSW1 to FSWn, compensation impedance switches CSW1 to CSWn and current switches ISW1 to ISWn is determined according to bits b1 to b4 of the control signal CTRL. For example, since the bits b1 to b4 of the control signal CTRL corresponding to a gain of −12 dB are "1111", the first to fourth feedback impedance switches FSW1 to FSW4, the first to fourth compensation impedance switches CSW1 to CSW4 and the first to fourth current switches ISW1 to ISW4 are turned on in response to the control signal CTRL.

Figure 4:
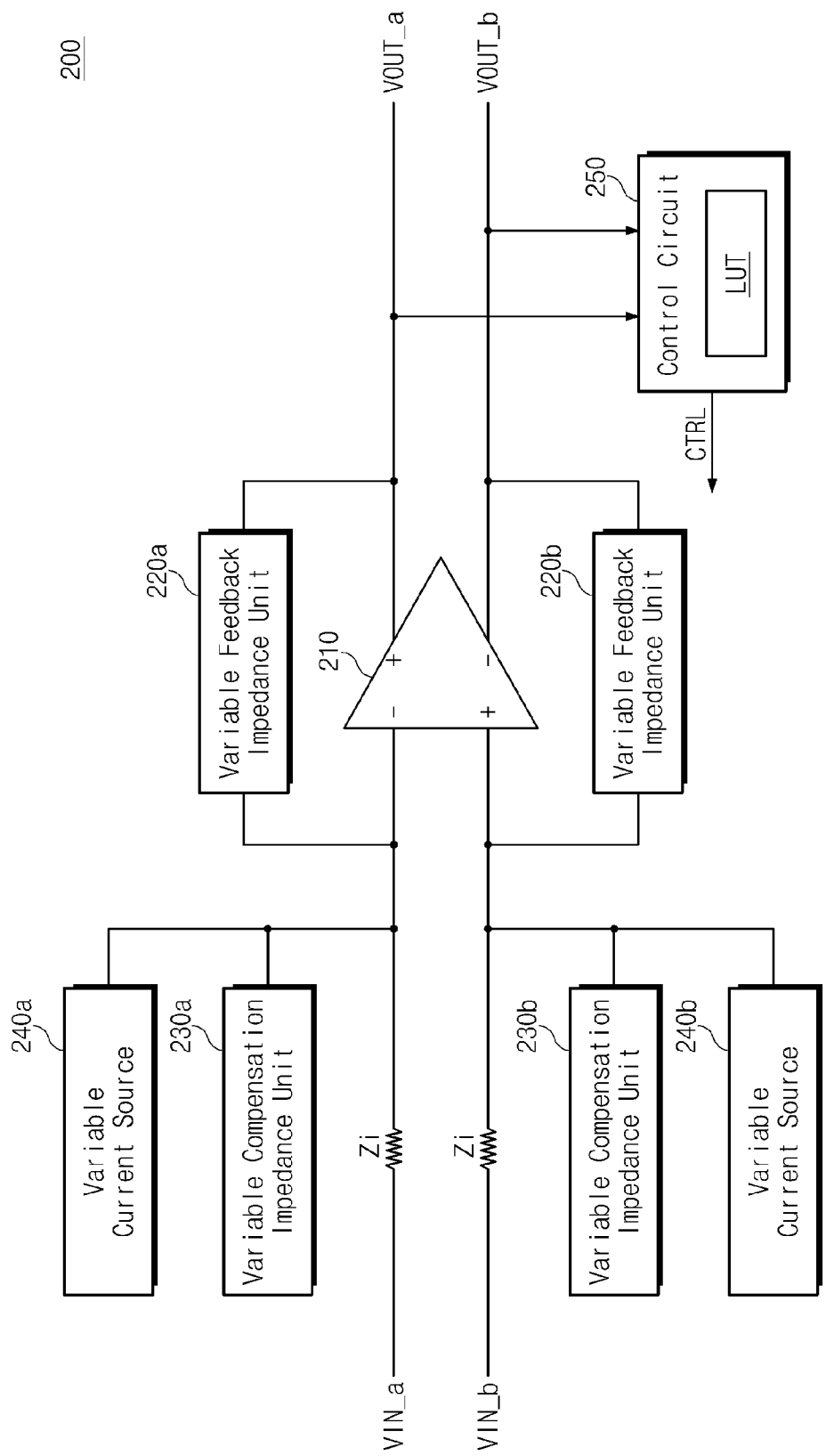
FIG. 4 is a block diagram illustrating a variable gain amplifier according to a second embodiment of the present invention.

FIG. 4 is a block diagram illustrating a variable gain amplifier according to a second embodiment of the present invention.

Referring to FIG. 4, a variable gain amplifier 200 includes a differential amplifier 210, variable feedback impedance units 220a and 220b, variable compensation impedance units 230a and 230b, variable current sources 240a and 240b, and a control circuit 250.

The variable gain amplifier 200 according to the second embodiment of the present invention is implemented as a differential variable gain amplifier having a symmetrical structure with respect to the variable gain amplifier 100 (see FIG. 1) according to the first embodiment of the present invention. Therefore, repetitive description on the same elements as those of the variable gain amplifier 100 according to the first embodiment of the present invention will be omitted.

The differential amplifier 210 receives voltages through an inverting input terminal and a non-inverting input terminal to amplify a voltage difference between the inverting input terminal and the non-inverting input terminal, and outputs the amplified voltage. The inverting input terminal and non-inverting input terminal of the differential amplifier 210 are connected to input impedance elements Zi, respectively.

The first variable feedback impedance unit 220a is connected between the inverting input terminal and non-inverting output terminal of the differential amplifier 210. The second variable feedback impedance unit 220b is connected between the non-inverting input terminal and inverting output terminal of the differential amplifier 210.

The first variable compensation impedance unit 230a is connected to the inverting input terminal of the differential amplifier 210, and the second variable compensation impedance unit 230b is connected to the non-inverting input terminal of the differential amplifier 210.

The first variable current source 240a is connected to the inverting input terminal of the differential amplifier 210, and the second variable current source 240b is connected to the non-inverting input terminal of the differential amplifier 210.

The control circuit 250 transfers a control signal CTRL to the variable feedback impedance units 220a and 220b, the variable compensation impedance units 230a and 230b, and the variable current sources 240a and 240b.

Figure 5:
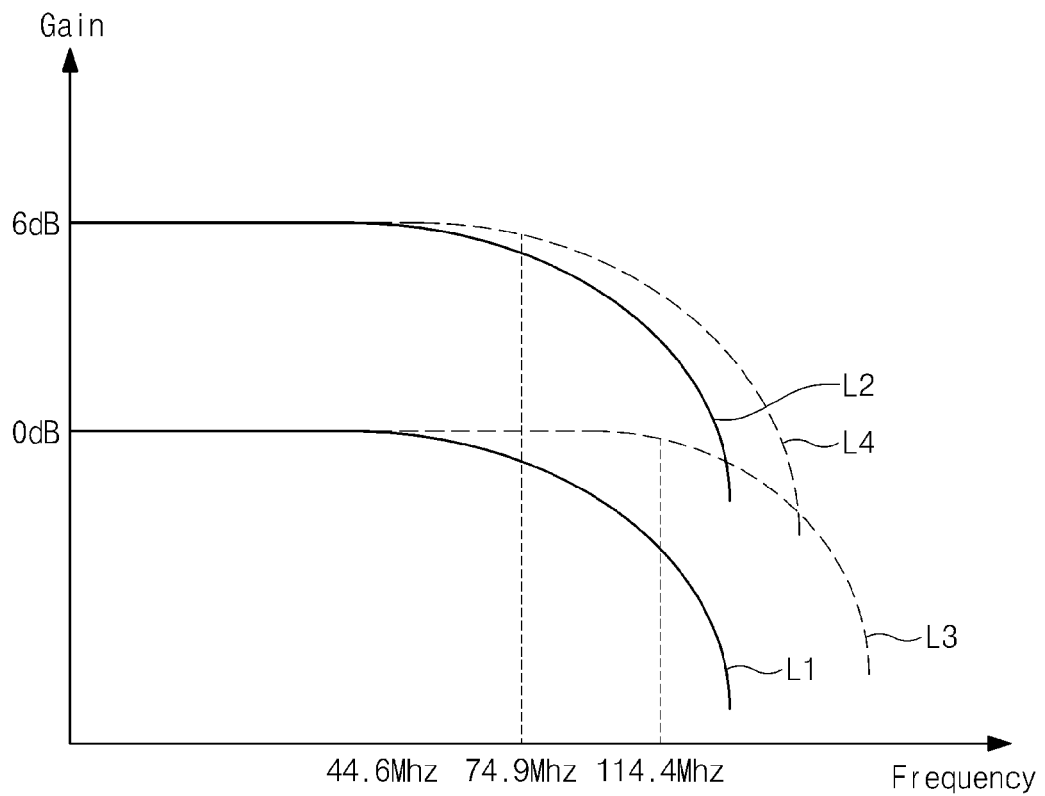
FIG. 5 is a graph showing a simulation result for frequency characteristic of a variable gain amplifier according to an embodiment of the present invention.

FIG. 5 is a graph showing a simulation result for frequency characteristic of a variable gain amplifier according to an embodiment of the present invention.

In FIG. 5, first and second lines L1 and L2 indicate the frequency characteristics of a variable gain amplifier according to an embodiment of the present invention, and third and fourth lines L3 and L4 indicate the frequency characteristics of a typical variable gain amplifier.

According to the variable gain amplifier of the present invention, it can be seen that a bandwidth is maintained at 44.6 Mhz even when a gain varies. According to the typical variable gain amplifier, on the other hand, it can be seen that as a gain increases from 0 dB to 6 dB, a bandwidth decreases from 114.4 Mhz to 74.9 Mhz.

According to the embodiments of the present invention, the variable gain amplifier does not require a compensation capacitor for maintaining constant frequency characteristic even when a gain varies, thereby decreasing the area. Furthermore, the variable gain amplifier prevents a high voltage from being applied to the compensation impedance even when a high common mode input voltage is applied, thereby reducing power consumption. Moreover, the variable current source supplying a current to the compensation impedance is connected to the input node, and thus influence of output voltage swing can decrease.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A variable gain amplifier comprising:
an operational amplifier;
a variable feedback impedance unit connected between an inverting input terminal and output terminal of the operational amplifier, and having a feedback impedance value which varies for gain control;
a variable compensation impedance unit connected to the inverting input terminal, and having a compensation impedance value which varies in response to change of the feedback impedance value for maintaining a constant feedback factor; and
a variable current source connected to the inverting input terminal, and supplying an output current, which varies in response to change of the compensation impedance value, to the variable compensation impedance unit,
wherein the variable current source comprises a current mirror varying the output current driven by a reference current to supply the varied output current to the variable compensation impedance unit.

2. The variable gain amplifier of claim 1, wherein,
the variable feedback impedance unit comprises a fixed feedback impedance element, and a plurality of selection feedback impedance elements, and
each of the selection feedback impedance elements is selectively connected to the fixed feedback impedance element in parallel.

3. The variable gain amplifier of claim 2, wherein,
the variable compensation impedance unit comprises a plurality of MOS transistors and a plurality of compensation impedance elements which respectively correspond to the selection feedback impedance elements,
each of the compensation impedance elements is connected between the inverting input terminal and one of a drain and source of a corresponding MOS transistor,
the other of the drain and source of the corresponding MOS transistor is selectively connected to a ground, and
a gate of the corresponding MOS transistor is connected to one of the drain and the source.

4. The variable gain amplifier of claim 2, wherein the variable current source comprises a plurality of independent current sources selectively connected between a driving power source and the inverting input terminal.

5. The variable gain amplifier of claim 1, further comprising a control circuit generating a control signal on the basis of a look up table which comprises information on gain control,
wherein the feedback impedance value, the compensation impedance value and the output current vary in response to the control signal.

6. A variable gain amplifier comprising:
an operational amplifier;
a fixed feedback impedance element connected between an inverting input terminal and output terminal of the operational amplifier;
a selection feedback impedance element selectively connected to the fixed feedback impedance element in parallel;
a MOS transistor having a gate, a drain and a source, wherein one of the drain and the source is selectively connected to a ground, and the other is connected to the gate;
a compensation impedance element connected between the inverting input terminal and the other of the drain and source of the MOS transistor; and
a current source selectively connected between a driving power source and the inverting input terminal.

7. The variable gain amplifier of claim 6, further comprising a control circuit generating a control signal on the basis of a look up table which comprises information on gain control,
wherein whether to respectively connect the selection feedback impedance element, the MOS transistor and the current source is determined by the control signal.

8. The variable gain amplifier of claim 7, further comprising an input impedance element connected to the inverting input terminal,
wherein a rate of an impedance value of the fixed feedback impedance element to an impedance value of the input impedance element is the same as a rate of an impedance value of the selection feedback impedance element to a value which is obtained by summing an impedance value of the compensation impedance element and an impedance value of the MOS transistor.

9. The variable gain amplifier of claim 8, wherein the current source generates an output current corresponding to a compensation impedance current which flows through the compensation impedance element and the MOS transistor.

10. The variable gain amplifier of claim 8, wherein the current source comprises a current mirror generating an output current driven by a reference current.

11. A variable gain amplifier comprising:
an operational amplifier;
a first variable feedback impedance unit connected between an inverting input terminal and non-inverting output terminal of the operational amplifier, and having a first feedback impedance value;
a second variable feedback impedance unit connected between a non-inverting input terminal and inverting output terminal of the operational amplifier, and having a second feedback impedance value;
a first variable compensation impedance unit connected to the inverting input terminal, and having a first compensation impedance value which varies in response to change of the first feedback impedance value for maintaining a constant first feedback factor;
a second variable compensation impedance unit connected to the non-inverting input terminal, and having a second compensation impedance value which varies in response to change of the second feedback impedance value for maintaining a constant second feedback factor;
a first variable current source connected to the inverting input terminal, and supplying a first output current, which varies in response to change of the first compensation impedance value, to the first variable compensation impedance unit; and
a second variable current source connected to the non-inverting input terminal, and supplying a second output current, which varies in response to change of the second compensation impedance value, to the second variable compensation impedance unit.

12. The variable gain amplifier of claim 11, further comprising:
a first input impedance element connected to the inverting input terminal; and
a second input impedance element connected to the non-inverting input terminal,
wherein,
the first feedback factor is defined as a rate of the first feedback impedance value to a combined impedance value which is obtained by combining an input impedance value of the first input impedance element and the first compensation impedance value, and the second feedback factor is defined as a rate of the second feedback impedance value to a combined impedance value which is obtained by combining an input impedance value of the second input impedance element and the second compensation impedance value.

13. The variable gain amplifier of claim 12, wherein the first and second feedback factors are the same.

14. The variable gain amplifier of claim 11, wherein each of the first and second variable current sources comprises a current mirror having a cascode structure.

15. The variable gain amplifier of claim 11, further comprising a control circuit generating a control signal on the basis of a monitored result for an output voltage between the inverting output terminal and the non-inverting output terminal, wherein the first and second feedback impedance values, the first and second compensation impedance values, and the first and second output currents vary in response to the control signal.

* * * * *